United States Patent
Yu et al.

(10) Patent No.: US 8,872,441 B2
(45) Date of Patent: Oct. 28, 2014

(54) CONTROLLER AND LED DRIVING CIRCUIT WITH PROTECTION FUNCTION

(75) Inventors: Chung-Che Yu, New Taipei (TW); Li-Min Lee, New Taipei (TW); Shian-Sung Shiu, New Taipei (TW)

(73) Assignee: Green Solution Technology Co., Ltd., New Taipei (TW)

( * ) Notice: Subject to any disclaimer, the term of this patent is extended or adjusted under 35 U.S.C. 154(b) by 183 days.

(21) Appl. No.: 13/354,295

(22) Filed: Jan. 19, 2012

(65) Prior Publication Data
US 2012/0242249 A1 Sep. 27, 2012

(30) Foreign Application Priority Data

Mar. 22, 2011 (TW) .............................. 100109786 A

(51) Int. Cl.
*H05B 37/02* (2006.01)
*H05B 33/08* (2006.01)
*H03K 17/082* (2006.01)

(52) U.S. Cl.
CPC ........ *H05B 33/0884* (2013.01); *H03K 17/0822* (2013.01)
USPC ........... 315/291; 315/297; 315/307; 327/109; 327/540

(58) Field of Classification Search
CPC . H05B 33/0884; H03K 17/08; H03K 17/082; H03K 17/0822
USPC .................................................. 327/109, 540
See application file for complete search history.

(56) References Cited

U.S. PATENT DOCUMENTS

| | | | | |
|---|---|---|---|---|
| 6,424,131 | B1* | 7/2002 | Yamamoto et al. | 323/282 |
| 6,496,168 | B1* | 12/2002 | Tomida | 345/76 |
| 8,049,690 | B2* | 11/2011 | Wu et al. | 345/82 |
| 2002/0050853 | A1* | 5/2002 | Hosoki | 327/538 |
| 2002/0171455 | A1* | 11/2002 | Tsuchida et al. | 327/108 |
| 2005/0162216 | A1* | 7/2005 | Ueda | 327/540 |
| 2008/0315773 | A1 | 12/2008 | Pang | |
| 2009/0058313 | A1* | 3/2009 | Chang et al. | 315/276 |

FOREIGN PATENT DOCUMENTS

| | | |
|---|---|---|
| CN | 101103468 A | 1/2008 |
| CN | 201307951 Y | 9/2009 |
| CN | 101902855 A | 12/2010 |

OTHER PUBLICATIONS

"First Office Action of Taiwan Counterpart Application", issued on Apr. 14, 2014, p. 1-p. 7, in which the listed reference was cited.
"First Office Action of China Counterpart Application", issued on Dec. 3, 2013, p. 1-p. 10, in which the listed references were cited.

* cited by examiner

Primary Examiner — Jason M Crawford
(74) Attorney, Agent, or Firm — Jianq Chyun IP Office

(57) ABSTRACT

A controller with protection function, for controlling a transistor having a control terminal, a first terminal coupled to a load, a second terminal, is disclosed. The controller comprises a judgment unit and a current control unit. The judgment unit is coupled to the transistor and generates a current reducing signal when a potential of the first terminal of the transistor or a voltage difference between the first terminal and the second terminal of the transistor is higher than a preset value. The current control unit is coupled to the control terminal of the transistor for substantially stabilizing the current flowing through the transistor at a preset current value, and reduces the current flowing from the preset current value when receiving the current reducing signal.

6 Claims, 3 Drawing Sheets

CONTROLLER AND LED DRIVING CIRCUIT WITH PROTECTION FUNCTION

CROSS-REFERENCE TO RELATED APPLICATION

This application claims the priority benefit of Taiwan application serial no. 100109786, filed on Mar. 22, 2011. The entirety of the above-mentioned patent application is hereby incorporated by reference herein and made a part of this specification.

BACKGROUND

1. Field of the Invention

The present invention relates to a controller and an LED driving circuit, and more particularly a controller and an LED driving circuit with protection function.

2. Description of Related Art

FIG. 1 is a circuit diagram of a conventional LED driving circuit. The LED driving circuit comprises a driving unit 110, an LED module 120, an N-type MOSFET 130, a current detecting resistance 140 and an error amplifier 160. The driving unit 110 is coupled to a terminal of the LED module 120 to provide a driving voltage VDR to drive the LED module 120 for lighting. The N-type MOSFET 130 is coupled to the other terminal of the LED module 120 to control an amount of a current flowing through the LED module 120 according to a control signal. The current detecting resistance 140 is coupled to the N-type MOSFET 130 to detect the amount of the current flowing through the LED module 120 and generate a current detecting signal Ifb. The error amplifier 160 receives the current detecting signal Ifb and a current set signal generated by a current set unit 150 and accordingly outputs a control signal to the N-type MOSFET 130 to control the amount of the current flowing through the N-type MOSFET 130.

A voltage in a drain of the N-type MOSFET 130 may be increased when one or more LEDs of the LED module 120 are short-circuited. Therefore, a power consumption of the N-type MOSFET 130 is also increased to cause a temperature increased thereof. Further, a safe operating area of the N-type MOSFET 130 is diminished when operating in a high temperature and so a reliability of the N-type MOSFET 130 is decreased or even the N-type MOSFET 130 is damaged.

SUMMARY

The present invention decreases an amount of a current flowing through a transistor to protect the transistor from being damaged due to operating under over temperature condition resulted from that a voltage across the transistor is over large.

To accomplish the aforementioned and other objects, an exemplary embodiment of the invention provides a controller with protection function which is used to control a transistor having a control terminal, a first terminal coupled to a load and a second terminal. The controller comprises a judgment unit and a current control unit. The judgment unit is coupled to the transistor and generates a current reducing signal when a potential of the first terminal of the transistor or a voltage difference between the first terminal and the second terminals is higher than a preset value. The current control unit is coupled to the control terminal of the transistor to control a current flowing through the transistor to be substantially a preset current value and reduces the current when receiving the current reducing signal.

An exemplary embodiment of the invention also provides an LED driving circuit comprising an LED module, a driving unit and a controller. The LED module has a plurality of LEDs connected in series. The driving unit is coupled to a terminal of the LED module to provide a driving voltage to drive the LED module for lighting. The controller is coupled to the other terminal of the LED module to control an amount of a current flowing through the LED module. The controller substantially stabilizes the current flowing through the LED module at a first current value when a voltage across of the LED module is higher than a first preset value and substantially stabilizes the current flowing through the LED module at a second current value when the voltage across of the LED module is lower than the first preset value, wherein the second current value is lower than the first current value.

An exemplary embodiment of the invention further provides an LED driving circuit comprising an LED module, a driving unit and a transistor. The LED module has a plurality of LEDs connected in series. The driving unit is coupled to a terminal of the LED module to provide a driving voltage to drive the LED module for lighting. The transistor has a control terminal, a first terminal coupled to the LED module and a second terminal. The controller is used to control an amount of a current flowing through the transistor. The controller substantially stabilizes the current flowing through the transistor at a first current value when a voltage across the transistor is lower than a first preset value and reduces the amount of the current flowing through the transistor when the voltage across the transistor is higher than the first preset value.

It is to be understood that both the foregoing general description and the following detailed description are exemplary, and are intended to provide further explanation of the invention as claimed. In order to make the features and the advantages of the invention comprehensible, exemplary embodiments accompanied with figures are described in detail below.

BRIEF DESCRIPTION OF THE DRAWINGS

The present invention will now be specified with reference to its preferred embodiment illustrated in the drawings, in which.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
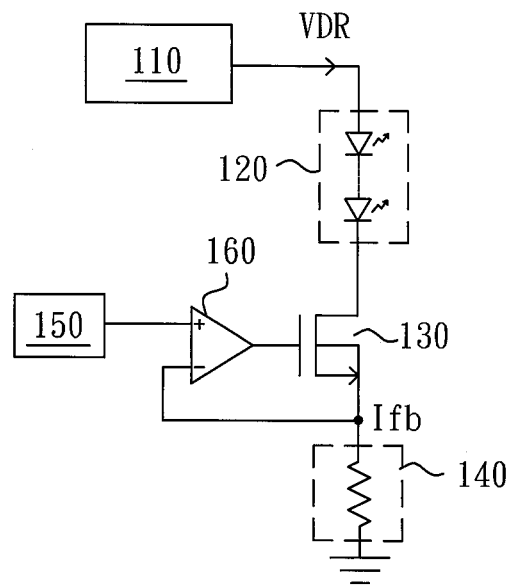
FIG. 1 is a circuit diagram of a conventional LED driving circuit.
Figure 2:
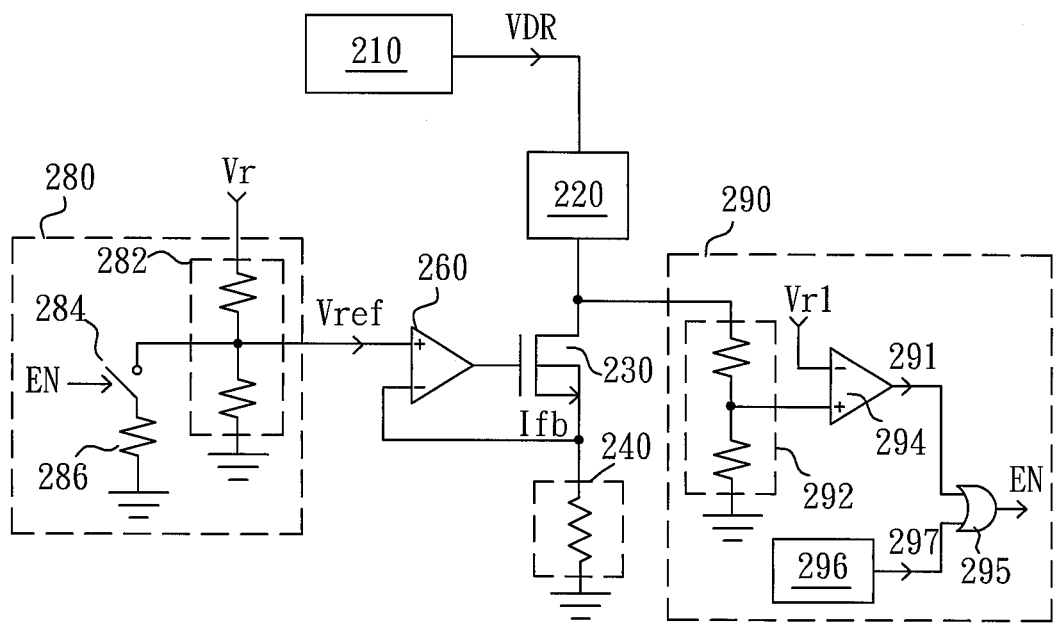
FIG. 2 is a schematic diagram of a controller with protection function of the present invention.

FIG. 2 is a schematic diagram of a controller with protection function of the present invention. The controller comprises a transistor 230, a current control unit and a judgment unit 290, wherein the current control unit comprises an error amplifier 260 and a reference voltage generating unit 280. The transistor 230 may be built-in element or an external element. The transistor 230 has a control terminal, a first terminal and a second terminal. The first terminal of the transistor 230 is coupled to a terminal of a load 220 and a driving unit 210 is coupled to the other terminal of the load 220 to provide a driving voltage VDR to drive the load 220. A current detecting unit 240 is coupled to the second terminal of the transistor 230 to generate a current detecting signal Ifb. In the present embodiment, the current detecting unit 240 is a resistance. The error amplifier 260 receives the current detecting signal Ifb and a reference voltage Vref generated by the reference voltage generating unit 280 and controls an amount of a current flowing through the transistor 230 to be substantially stabilized at a preset current value. The judgment unit 290 comprises a first voltage divider element 292 coupled to the first terminal of the transistor 230 to generate a first voltage divider signal, and a comparison element 294. An inverting terminal of the comparison element 294 receives a first compared reference voltage Vr1 and a non-inverting terminal thereof receives the first voltage divider signal. Accordingly, a current reducing signal EN is generated when a level of the first voltage divider signal is higher than the first compared reference voltage Vr1.

The reference voltage generating unit 280 comprises a second voltage divider element 282, a switch element 284 and a voltage adjustment element 286. A terminal of the switch element 284 is coupled to the second voltage divider element 282 and the other terminal thereof is coupled to the voltage adjustment element 286. The voltage adjustment element 286 is a resistance in the present embodiment. The second voltage divider element 282 receives a base voltage Vr to generate a reference voltage Vref. The switch element 284 is turned on to change a voltage divider ratio of the second voltage divider element 282 to lower a level of the reference voltage Vref when the judgment unit 290 generates a current reducing signal EN. The error amplifier 260 controls the transistor 230 to make the level of the current detecting signal Ifb is equal to the level of the reference voltage Vref. When the potential of the first terminal of the transistor 230 is lower than a preset current reducing value (i.e., the level of the first voltage divider signal is lower than the level of the first compared reference voltage Vr1), the current flowing through the transistor 230 is substantially stabilized at a first current value. When the potential of the first terminal of the transistor 230 is higher than the preset current reducing value, the judgment unit 290 generates the current reducing signal EN to turn on the switch element 284 to make the level of the reference voltage Vref reduced. At this time, the error amplifier 260 controls the transistor 230 to reduce the current flowing through the transistor 230 until the level of the current detecting signal Ifb to be equal to the level of the reference voltage Vref after reduced. Then, the current flowing through the transistor 230 is substantially stabilized at a second current value.

By means of the error amplifier 260, the level of the current detecting signal Ifb is equal to the level of the reference voltage Vref and that is the level of the current detecting signal Ifb (i.e., the second terminal of the transistor 230) is a stable value. Therefore, the judgment unit 290 is coupled to the first terminal of the transistor 230 to judge a voltage difference between the first terminal and the second terminal of the transistor 230 by detecting the potential of the first terminal in the present embodiment. In actually, the judgment unit 290 may be coupled to the first and second terminals of the transistor 230 to directly determine whether generating the current reducing signal EN or not according to the voltage difference between the first and second terminals of the transistor 230, and so the controller of the present invention is applicable to any circuit systems.

Figure 3:
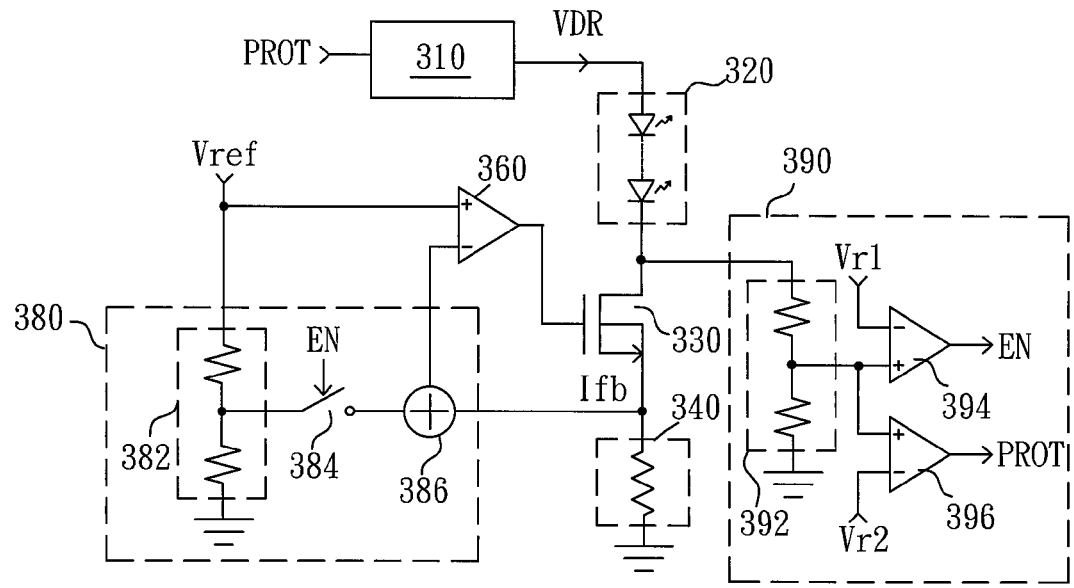
FIG. 3 is a schematic diagram of an LED driving circuit with protection function according to a first embodiment of the present invention.

FIG. 3 is a schematic diagram of an LED driving circuit with protection function according to a first embodiment of the present invention. The LED driving circuit comprises a driving unit 310, an LED module 320 and a controller, wherein the controller comprises a transistor 330, an error amplifier 360, a signal add unit 380 and a judgment unit 390. The transistor 330 is built-in internally in the controller in the present embodiment, and may be an external element in actual application. The driving unit 310 is coupled to a terminal of the LED module 320 to provide a driving voltage VDR to drive the LED module 320 for lighting. The transistor 330 has a control terminal, a first terminal coupled to the other terminal of the LED module 320 and a second terminal coupled to a current detecting unit 340. The current detecting unit 340 generates a current detecting signal Ifb according to an amount of a current flowing through the transistor 330. The judgment unit 390 comprises a first voltage divider element 392 and comparison elements 394, 396. The first voltage divider element 392 is coupled to the first terminal of the transistor 330 to generate a first voltage divider signal. An inverting terminal of the comparison element 394 receives a first compared reference voltage Vr1 and a non-inverting terminal thereof received the first voltage divider signal. An inverting terminal of the comparison element 396 receives a second compared reference voltage Vr2 and a non-inverting terminal thereof received the first voltage divider signal, wherein the level of the second compared reference voltage Vr2 is higher than the level of the first compared reference voltage Vr1. The voltage across the transistor 330 may be increased when a voltage across the LED module 320 is reduced due to that one or more LEDs are short-circuited. The comparison element 394 generates a current reducing signal EN when the level of the first voltage divider signal is higher than the level of the first compared reference voltage Vr1. Further, the comparison element 396 generates a protection signal PROT when the level of the first voltage divider signal is higher than the level of the second compared reference voltage Vr2.

The signal add unit 380 determines whether the level of the current detecting signal Ifb is increased a preset value or not according to the current reducing signal EN. The signal add unit 380 comprises a second voltage divider element 382, a switch element 384 and a signal adder 386. A terminal of the switch element 384 is coupled to the second voltage divider element 382 and the other terminal thereof is coupled to the signal adder 386. The second voltage divider 382 receives a reference voltage Vref to generate a second voltage divider signal. The switch element 384 determines whether the second voltage divider signal is transmitted to the signal adder 386 or not according to the current reducing signal EN. If the second voltage divider signal is transmitted to the signal adder 386, the level of the current detecting signal Ifb is increased according to the voltage divider signal. The error amplifier 360 receives a signal generated by the signal adder 386 and the reference voltage Vref and accordingly controls the amount of the current flowing through the transistor 330. A level of the signal generated by the signal add unit 380 is a sum of the second voltage divider signal and the current detecting signal Ifb when the current reducing signal EN generated. Therefore, the error amplifier 360 reduces the current flowing through the transistor 330 to be a second current value from a first current value and keeps the level of the signal generated by the signal add unit 380 being equal to the level of the reference voltage Vref.

Compared with the judgment unit 290 shown in the FIG. 2, the judgment unit 390 further comprises the comparison element 396. The comparison element 396 generates a protection signal PROT if the voltage of the first terminal of the transistor 330 is increased abnormally and even higher than a withstanding voltage of the transistor 330. In the present embodiment, the driving unit 310 can stop driving the LED module 320 to avoid damaging the transistor 330 according to the protection signal PROT.

Figure 4:
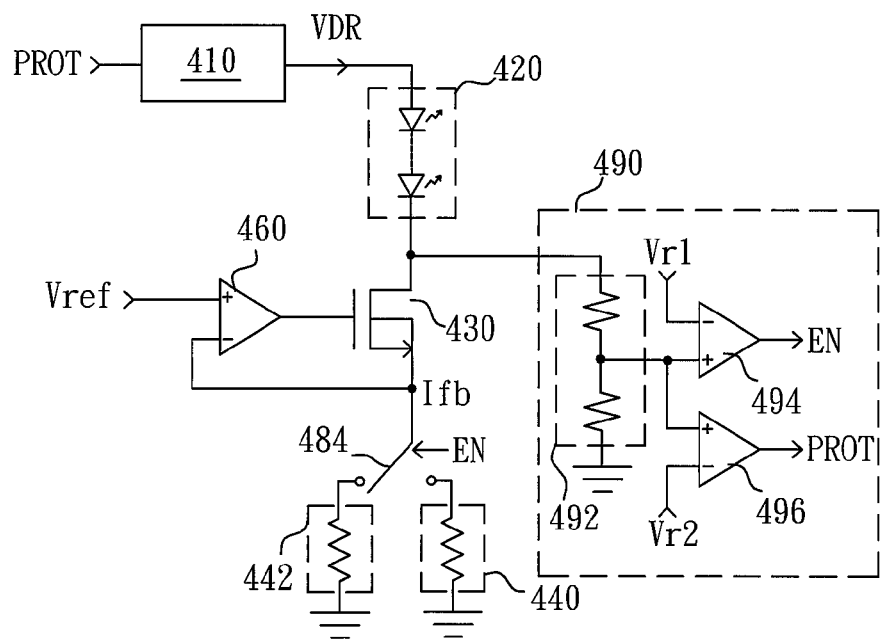
FIG. 4 is a schematic diagram of an LED driving circuit with protection function according to a second embodiment of the present invention.

FIG. 4 is a schematic diagram of an LED driving circuit with protection function according to a second embodiment of the present invention. The LED driving circuit comprises a driving unit 410, an LED module 420, a transistor 430 and a controller, wherein the controller comprises a select switch 484, an error amplifier 460 and a judgment unit 490. The driving unit 410 is coupled to a terminal of the LED module 420 to provide a driving voltage VDR to drive the LED module 420 for lighting. The transistor 430 has a control terminal, a first terminal and a second terminal. The first terminal of the transistor 430 is coupled to the other terminal of the LED module 420 and the second terminal thereof is coupled to a current detecting unit by the select element 484 to generate a current detecting signal Ifb, wherein the current detecting unit comprises a first current detecting resistance 440 and a second current detecting resistance 442. The select switch 484 is coupled to the transistor 430 and one of a first current detecting resistance 440 and the second current detecting resistance 442 in response to a current reducing signal EN. The judgment unit 490 comprises a first voltage divider element 492 and comparison elements 494, 496. The first voltage divider element 492 is coupled to a potential of the first terminal of the transistor 430 to generate a first voltage divider signal. An inverting terminal of the comparison element 494 receives a first compared reference voltage Vr1 and a non-inverting terminal thereof receives the first voltage divider signal. The comparison element 494 generates the current reducing signal EN when the level of the first voltage divider signal is higher than the level of the first compared reference voltage Vr1. An inverting terminal of the comparison element 496 receives a second compared reference voltage Vr2 and a non-inverting terminal thereof receives the first voltage divider signal. The comparison element 496 generates a protection signal PROT when the level of the first voltage divider signal is higher than the level of the second compared reference voltage Vr2, wherein the level of the second compared reference voltage Vr2 is higher than the level of the first compared reference voltage Vr1.

An inverting terminal of the error amplifier 460 receives the current detecting signal Ifb and a non-inverting terminal thereof receives a reference voltage Vref to accordingly output a control signal to the control terminal of the transistor 430, and so the level of the current detecting signal Ifb is equal to the level of the reference voltage Vref. In the present embodiment, the switch element 484 is coupled to the transistor 430 and the first current detecting resistance 440 when the current reducing signal EN is at low level (that is the level of the first voltage divider signal lower than the level of the first compared reference voltage Vr1). The error amplifier 460 substantially stabilizes the current flowing through the transistor 430 at a first current value. The switch element 484 is coupled to the transistor 430 and the second current detecting resistance 442 when the current reducing signal EN is at high level (that is the level of the first divided signal is higher than the level of the first compared reference voltage Vr1). The resistance value of the second current detecting resistance 442 is higher than the resistance value of the first current detecting resistance 440. Therefore, the error amplifier 460 substantially stabilizes the current flowing through the transistor 430 at a second current value, wherein the second current value is lower than the first current value.

The comparison element 496 is triggered to generate the protection signal PROT when the voltage of the first terminal of the transistor 430 is still increased due to abnormal conditions. The driving unit 410 stops driving the LED module 420 to avoid damaging the transistor 430 according to the protection signal PROT.

Figure 5:
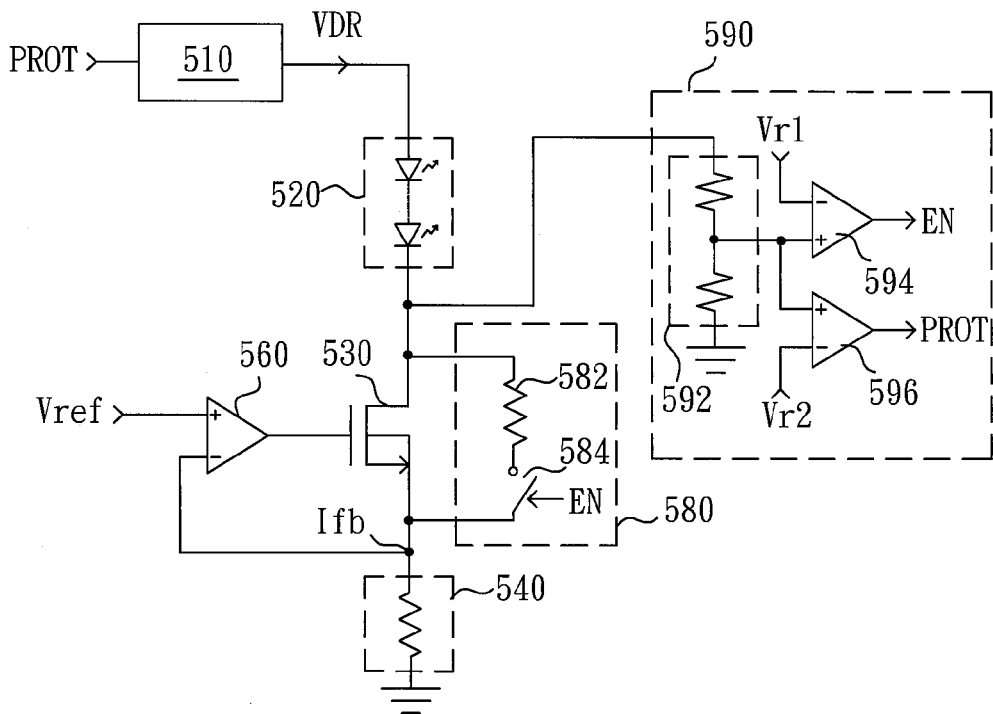
FIG. 5 is a schematic diagram of an LED driving circuit with protection function according to a third embodiment of the present invention.

FIG. 5 is a schematic diagram of an LED driving circuit with protection function according to a third embodiment of the present invention. The LED driving circuit comprises a driving unit 510, an LED module 520 and a controller, wherein the controller comprises a transistor 530, an error amplifier 560, a current dividing unit 580 and a judgment unit 590. The driving unit 510 is coupled to a terminal of the LED module 520 to provide a driving voltage VDR to drive the LED module 520 for lighting. The transistor 530 has a control terminal, a first terminal coupled to the other terminal of the LED module 520 and a second terminal coupled to a current detecting unit 540. The current detecting unit 540 is a resistance and generates a current detecting signal Ifb according to an amount of a current flowing through the LED module 520. The error amplifier 560 controls the transistor 530 to substantially stabilize the current flowing through the LED module 520 (and the transistor 530) at a first current value according to the current detecting signal Ifb and a reference voltage Vref.

The judgment unit 590 comprises a first voltage divider element 592 and comparison elements 594, 596. The first voltage divider element 592 is coupled to the first terminal of the transistor 530 to generate a voltage divider signal. An inverting terminal of the comparison element 594 receives a first compared reference voltage Vr1 and a non-inverting terminal thereof receives the voltage divider signal. The comparison element 594 generates a current reducing signal EN when the level of the voltage divider signal is higher than the level of the first compared reference voltage Vr1. An inverting terminal of the comparison element 596 receives a second compared reference voltage Vr2 and a non-inverting terminal thereof receives the voltage divider signal. The comparison element 596 generates a protection signal PROT when the level of the voltage divider signal is higher than the level of the second compared reference voltage Vr2, wherein the level of the second compared reference voltage Vr2 is higher than the level of the first compared reference voltage Vr1. The current dividing unit 580 is coupled to the first and second terminals of the transistor 530 and determines whether dividing the current of the transistor 530 or not according to the current reducing signal EN. In the present embodiment, the current dividing unit 580 comprises a current dividing resistance 582 and a switch element 584 connected in series. The switch element 584 is turned on to make a part of current flowing through the LED module 520 to flow through the current dividing unit 580 when the current reducing signal EN is generated by the judgment unit 590. Therefore, the amount of the current flowing through the transistor 530 can be reduced. The comparison element 596 is triggered to generate the protection signal PROT when the voltage of the first terminal of the transistor 530 is increased abnormally. The driving unit 510 stops driving the LED module 520 to avoid the voltage of the first terminal of the transistor 530 exceeding a withstanding voltage of the transistor 530 according to the protection signal PROT.

Figure 6:
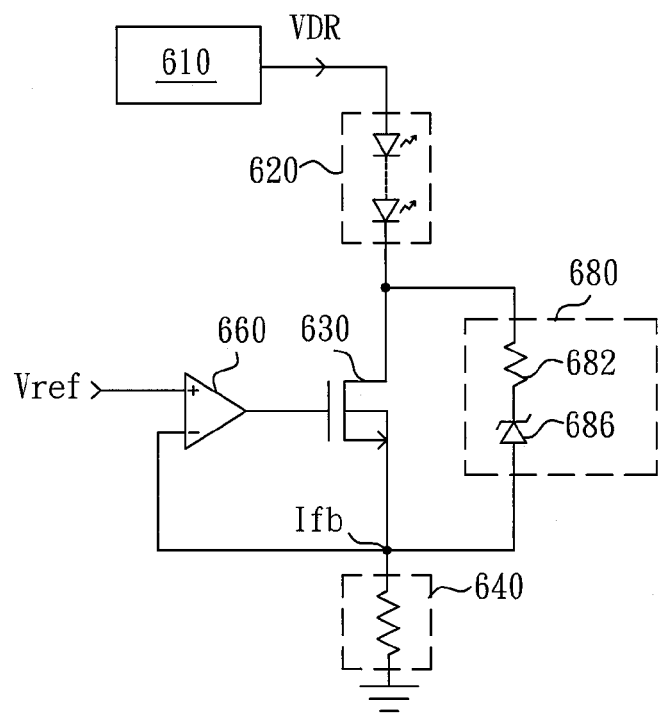
FIG. 6 is a schematic diagram of an LED driving circuit with protection function according to a forth embodiment of the present invention.

FIG. 6 is a schematic diagram of an LED driving circuit with protection function according to a forth embodiment of the present invention. The LED driving circuit comprises a driving unit 610, an LED module 620 and a controller, wherein the controller comprises a transistor 630, an error amplifier 660 and a current dividing unit 680. The driving unit 610 is coupled to a terminal of the LED module 620 to provide a driving voltage VDR to drive the LED module 620 for lighting. The transistor 630 has a control terminal, a first terminal coupled to the other terminal of the LED module 620 and a second terminal coupled to a current detecting unit 640. The current detecting unit 640 is a resistance and generates a current detecting signal Ifb according to an amount of a current flowing through the LED module 620. The error amplifier 660 controls the transistor 630 to substantially stabilize the current flowing through the LED module 620 to at a first current value according to the current detecting signal Ifb and a reference voltage Vref.

The current dividing unit 680 is connected with the transistor 630 in parallel and comprises a current dividing resistance 682 and a zener diode 686 connected in series. The current dividing unit 680 divides the current of the transistor 630 by the current dividing resistance 682 and the zener diode 686 when a voltage across the transistor 630 is higher than a preset value (that is a voltage across the transistor 630 is higher than a breakdown voltage of the zener diode 686.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A controller with protection function, used to control a transistor having a control terminal, a first terminal coupled to a load and a second terminal, comprising:
    a judgment unit, coupled to the transistor and generating a current reducing signal when a potential of the first terminal of the transistor or the voltage difference between the first terminal and the second terminal of the transistor is higher than a first preset value; and
    a current control unit, coupled to the control terminal of the transistor to control a current flowing through the transistor to substantially be a preset current value and reducing the current when receiving the current reducing signal,
    wherein the second terminal of the transistor is coupled to a current detecting unit which generates a current detecting signal according to an amount of a current flowing through the current detecting unit and controls the current flowing through the transistor according to the current detecting signal, the current detecting unit comprises a first current detecting resistance and a second current detecting resistance and the current control unit comprises a select switch, and an end of the select switch is coupled to the second terminal of the transistor and the other end thereof is coupled to the first current detecting resistance or the second current detecting resistance according to the current reducing signal.

2. The controller with protection function according to claim 1, wherein the judgment unit comprises a first voltage divider element coupled to the first terminal of the transistor and a comparison element coupled to the first voltage divider element, and the comparison element generates the current reducing signal according to the potential of the first terminal of the transistor and a first compared reference voltage.

3. The controller with protection function according to claim 1, wherein the judgment unit further generates a protection signal when the potential of the first terminal of the transistor or the voltage difference between the first terminal and the second terminal of the transistor is higher than a second preset value, in which the second preset value is higher than the first preset value.

4. A controller with protection function, used to control a transistor having a control terminal, a first terminal coupled to a load and a second terminal, comprising:
    a judgment unit, coupled to the transistor and generating a current reducing signal when a potential of the first terminal of the transistor or the voltage difference between the first terminal and the second terminal of the transistor is higher than a first preset value; and
    a current control unit, coupled to the control terminal of the transistor to control a current flowing through the transistor to substantially be a preset current value and reducing the current when receiving the current reducing signal, the current control unit further comprises a reference voltage generating unit which is used to generate a reference voltage, the current control unit adjusts the amount of the current flowing through the transistor according to the level of the reference voltage and the reference voltage generating unit reduces a level of the reference voltage when receiving the current reducing signal,
    wherein the reference voltage generating unit comprises a second voltage divider element, a switch element, and a voltage adjustment element, and the second voltage divider element receives a base voltage to generate a reference voltage, in which a terminal of the switch element is coupled to the second voltage divider element and another terminal thereof is coupled or de-coupled to the voltage adjustment element according to the current reducing signal to adjust the level of the reference voltage.

5. The controller with protection function according to claim 4, wherein the judgment unit further generates a protection signal when the potential of the first terminal of the transistor or the voltage difference between the first terminal and the second terminal of the transistor is higher than a second preset value, in which the second preset value is higher than the first preset value.

6. A controller with protection function, used to control a transistor having a control terminal, a first terminal coupled to a load and a second terminal, comprising:
    a judgment unit, coupled to the transistor and generating a current reducing signal when a potential of the first terminal of the transistor or the voltage difference between the first terminal and the second terminal of the transistor is higher than a first preset value; and
    a current control unit, coupled to the control terminal of the transistor to control a current flowing through the transistor to substantially be a preset current value and reducing the current when receiving the current reducing signal,
    wherein the second terminal of the transistor is coupled to a current detecting unit which generates a current detecting signal according to an amount of a current flowing through the current detecting unit and controls the current flowing through the transistor according to the current detecting signal, the current control unit further comprises a signal add unit which is coupled to the current detecting unit and increases the level of the current detecting signal at a preset value in response to the current reducing signal.

* * * * *